(12) United States Patent
Wang et al.

(10) Patent No.: US 7,423,976 B2
(45) Date of Patent: Sep. 9, 2008

(54) BLOCK ERROR RATE ESTIMATE REPORTING FOR TARGET SIGNAL TO INTERFERENCE RATIO ADJUSTMENT

(75) Inventors: Carl Wang, Flushing, NY (US); Pascal Adjakple, Great-Neck, NY (US)

(73) Assignee: Interdigital Technology Corporation, Wilmington, DE (US)

( * ) Notice: Subject to any disclaimer, the term of this patent is extended or adjusted under 35 U.S.C. 154(b) by 868 days.

(21) Appl. No.: 10/667,753

(22) Filed: Sep. 22, 2003

(65) Prior Publication Data
US 2004/0116142 A1 Jun. 17, 2004

Related U.S. Application Data

(60) Provisional application No. 60/413,165, filed on Sep. 24, 2002.

(51) Int. Cl.
G06F 11/00 (2006.01)
H04L 1/00 (2006.01)
(52) U.S. Cl. .................. 370/252; 370/333; 714/704
(58) Field of Classification Search ............. 714/705, 714/706
See application file for complete search history.

(56) References Cited

U.S. PATENT DOCUMENTS

| | | | |
|---|---|---|---|
| 5,216,692 A | 6/1993 | Ling | |
| 5,386,589 A | 1/1995 | Kanai | |
| 5,623,484 A | 4/1997 | Muszynski | |
| 5,818,820 A * | 10/1998 | Anderson et al. | 370/280 |
| 6,308,294 B1 | 10/2001 | Ghosh et al. | |
| 6,526,261 B1 * | 2/2003 | Takeuchi et al. | 455/69 |
| 6,567,670 B1 * | 5/2003 | Petersson | 455/522 |
| 6,654,922 B1 | 11/2003 | Numminen et al. | |
| 6,944,468 B2 * | 9/2005 | Okumura | 455/522 |
| 2002/0021682 A1 | 2/2002 | Ariyoshi et al. | |
| 2002/0042254 A1 | 4/2002 | Agin | |
| 2002/0054578 A1 | 5/2002 | Zhang et al. | |
| 2002/0187802 A1 | 12/2002 | Agin et al. | |
| 2003/0036403 A1 | 2/2003 | Shiu et al. | |
| 2003/0148780 A1 | 8/2003 | Takano | |
| 2005/0099957 A1 * | 5/2005 | Soldani et al. | 370/252 |

FOREIGN PATENT DOCUMENTS

CN 1271222 10/2000

(Continued)

*Primary Examiner*—Chau Nguyen
*Assistant Examiner*—Marcus Smith
(74) *Attorney, Agent, or Firm*—Volpe and Koenig, P.C.

(57) ABSTRACT

A method and apparatus is provided for reducing block error rate (BLER) estimate reporting to conserve system resources, while eliminating reports of BLER estimates unlikely to require an adjustment to target signal to interference ratio (SIR). A plurality of data blocks is received over a transmission time interval and the count of data blocks is stored in memory. The data blocks are error checked by an error check unit and the number of erroneous data blocks is stored in memory. A processor performs a BLER estimate calculation based on the data block count and erroneous data block count. A BLER estimate report is produced and sent for target SIR adjustment if triggered by threshold comparisons performed by the processor, including the data block count value compared to a predetermined threshold, and the BLER estimate value compared to a predetermined multiple of the target BLER value.

22 Claims, 4 Drawing Sheets

FOREIGN PATENT DOCUMENTS

| | | |
|---|---|---|
| CN | 1363145 | 8/2002 |
| JP | 2001-320744 | 11/2001 |
| JP | 2001320744 | 11/2001 |
| JP | 2002-026877 | 1/2002 |
| JP | 2002-152127 | 5/2002 |
| WO | 02/058278 | 7/2002 |
| WO | 02058278 | 7/2002 |

* cited by examiner

BLOCK ERROR RATE ESTIMATE REPORTING FOR TARGET SIGNAL TO INTERFERENCE RATIO ADJUSTMENT

CROSS REFERENCE TO RELATED APPLICATION(S)

This application claims priority from U.S. Provisional Application No. 60/413,165 filed on Sep. 24, 2002, which is incorporated by reference as if fully set forth.

FIELD OF THE INVENTION

The present invention relates generally to power control in wireless communications. More particularly, the invention relates to block error estimate reporting for target signal to interference ratio (SIR) adjustment for outer power loop control.

BACKGROUND OF THE INVENTION

Hereafter, a wireless transmit/receive unit (WTRU) includes, but is not limited to, a user equipment, mobile station fixed or mobile subscriber unit, pager, or any other type of device capable of operating in a wireless environment. When referred to hereafter, a base station includes, but is not limited to, a base station, Node B, site controller, access point or other interfacing device in a wireless environment.

FIG. 3 shows a block diagram of an exemplary wireless system, in this case according to the third generation partnership program (3GPP) wideband code division multiple access (W-CDMA) protocol. Communication system 10 comprises RNC 11, base station 14 and WTRU 16. RNC 11 and base station are part of a universal mobile telecommunications system (UMTS) terrestrial radio access network (UTRAN)). RNC 11 controls the radio resources of system 10 interfaces (e.g., frequencies, scrambling codes, spreading factors, and channel power), and comprises radio resource control (RRC) entity 12, medium access control (MAC) entity 13, and frame protocol (FP) entity 25. Logical channels 22 are defined between RRC 12 and MAC 13 for signaling data transfer services. Transport channels are defined on line 24 between MAC 13 and FP 25. MAC control line 23 is used for transfer of control information between MAC 13 and RRC 12.

Base station 14 is responsible for radio transmission and reception in one or more cells with WTRU 16. Interface 21 is an interconnection between the radio network at RNC 11 and base station 14. Base station 14 transmits on downlink (DL) signals 15 to WTRU 16. Uplink (UL) signals 26 are transmitted from WTRU 16 to base station 14.

A variety of services, such as video, voice and data, each having different Quality of Service (QoS) requirements, can be transmitted using a single wireless connection. This is accomplished by multiplexing several transport channels (TrCHs), each service on its own TrCH, onto a coded composite transport channel (CCTrCh). The transmitted information is sent in units of transport blocks (TBs). The rate at which each service is transmitted is on a transmission time interval (TTI). The smallest interval is one frame of data, typically defined as 10 ms for a 3GPP communication system. Depending on the service type parameters, several TBs may transmit in a single TTI.

In wireless communications, one of the most important features in maintaining the communication link quality under fading and interference situations is power control. A critical parameter that is monitored for effective power control is signal to interference ratio (SIR). Transmission power is controlled by comparing a received SIR to a target SIR and adjusting the transmit power up or down accordingly.

In 3GPP-like communication system such as system 10, in either time division duplex (TDD) mode or frequency division duplex (FDD) mode, RRC 12 sets the initial target SIR of WTRU 16 at the call session establishment and then subsequently continuously adjusts the target SIR of WTRU 16 during the life term of the call. The target SIR is sent to WTRU 16 by RRC 12. Power control is divided by initialization and steady state phases, each with separate BLER reporting requirements. The initialization phase of power control is for quickly establishing a target SIR value. The steady state phase of power control is more refined, and starts efficiently with the benefit of the SIR target established during the initialization phase.

The QoS requirement of each transmitted service can be monitored at the transport block level in terms of a block error rate (BLER). Consequently, each TrCH has its own target BLER, against which the measured or estimated BLER is regularly compared to ensure acceptable service quality. In order to monitor the BLER level on a CCTrCH basis, a reference transport channel (RTrCH) may be selected among the transport channels multiplexed on the considered CCTrCH.

An inner loop power control algorithm sets the power of the UL signal 26. The transmit power adjustment of WTRU 16 is based on receipt of the target SIR generated from outer loop power control performed in RNC 11. WTRU 16 receives the target SIR adjustment signal and estimates of downlink channels and responds by setting its output power to a specific value.

An outer loop power control algorithm performed by RNC 11 operates using BLER estimation to control the target SIR for the inner loop power control. The UL outer loop power control controls the target SIR to maintain the received BLER as close as possible to a target BLER based on the cyclic redundancy code (CRC) of the data. Upon receipt of the UL 26 signal, MAC 13 performs an estimation of the BLER and sends a BLER estimate report to RRC 12 across MAC control path 23. RRC 12 then performs target SIR adjustment if necessary. The output from the UL outer loop power control is a new target SIR per CCTrCH sent along with DL 15 for each UL inner loop power control.

SUMMARY OF THE INVENTION

A method and apparatus is provided for reducing block error rate (BLER) estimate reporting to conserve system resources, while eliminating BLER estimate reports of BLER estimates unlikely to require an adjustment to target signal to interference ratio (SIR). A plurality of data blocks is received over a transmission time interval and the count of data blocks is stored in memory. The data blocks are error checked by an error check unit and the number of erroneous data blocks is stored in memory. A processor performs a BLER estimate calculation based on the data block count and erroneous data block count. A BLER estimate report is produced and sent for target SIR adjustment if triggered by threshold comparisons performed by the processor, including the data block count value compared to a predetermined threshold, and the BLER estimate value compared to a predetermined multiple of the target BLER value.

BRIEF DESCRIPTION OF THE DRAWINGS

A more detailed understanding of the invention may be had from the following description of preferred embodiments, given by way of example and to be understood in conjunction with the accompanying drawing wherein.

ACRONYMS

The following acronyms are used in this application:
3G Third Generation
BLER block error rate
CCTrCH coded composite transport channel
CRC cyclic redundancy check
DL downlink
FP frame protocol
MAC medium access control
OLPC outer loop power control
QoS quality of service
RNC radio network controller
RRC radio resource control
RTrCH reference transport channel
SIR signal to interference ratio
TB transport block
TrCH transport channel
TTI transmission time interval
UL uplink
UMTS universal mobile telecommunications system
UTRAN UMTS terrestrial radio access network
WTRU wireless transmit/receive unit

DESCRIPTION OF PREFERRED EMBODIMENTS

Although the embodiments are described in conjunction with a third generation partnership program (3GPP) wideband code division multiple access (W-CDMA) system utilizing the time division duplex mode, the embodiments are applicable to any hybrid code division multiple access (CDMA)/time division multiple access (TDMA) communication system. Additionally, the embodiments are applicable to CDMA systems, in general, such as the proposed frequency division duplex (FDD) mode of 3GPP W-CDMA.

Figure 1:
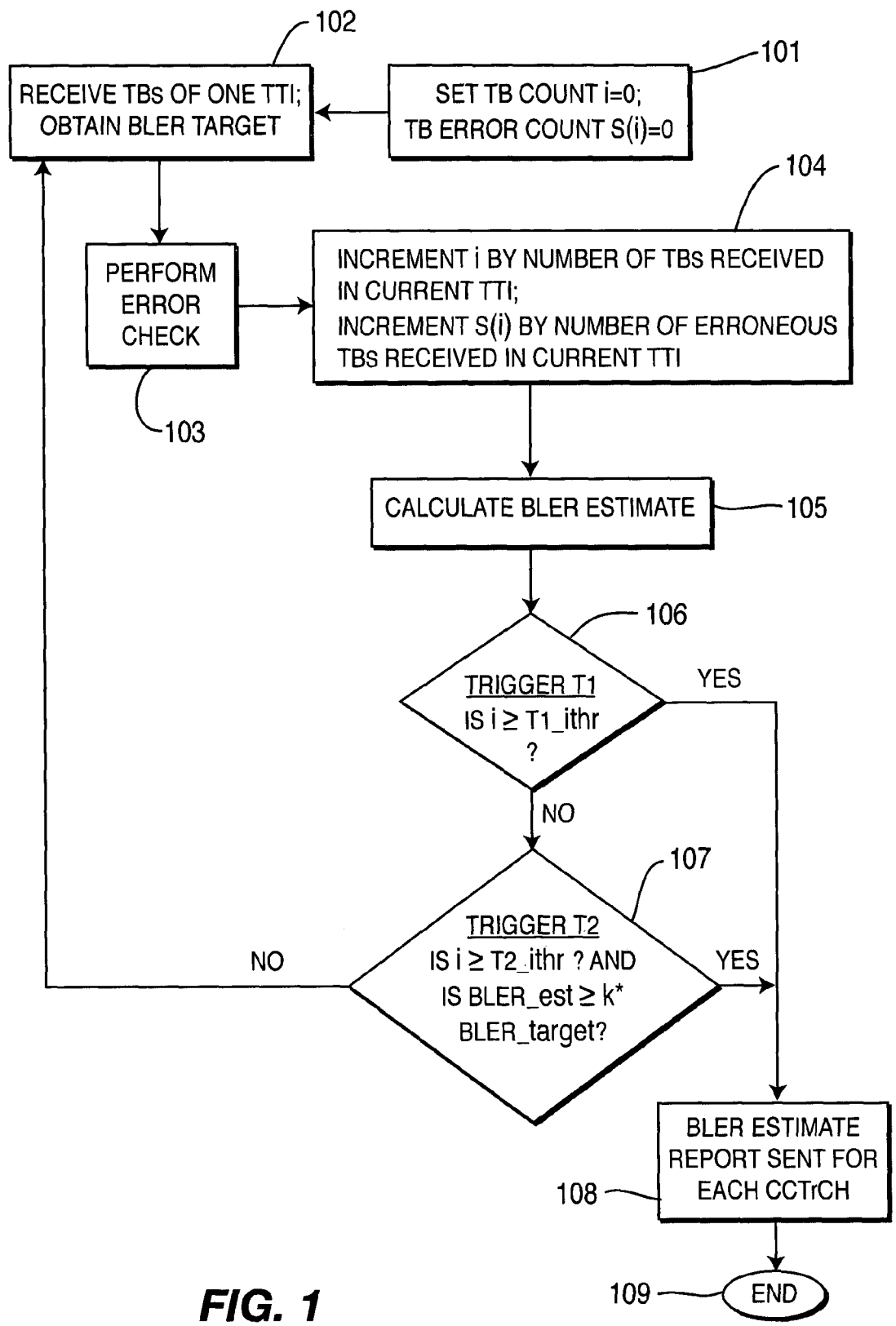
FIG. 1 shows a flow diagram for a method of BLER reporting during outer loop power control initialization phase.

FIG. 1 shows a flow diagram of method 100, which illustrates a block error rate (BLER) reporting process during the initialization phase of uplink (UL) outer loop power control (OLPC). Error checking performed during method 100 is performed on received data in the form of transport blocks (TBs) at each transmission time interval (TTI). A BLER estimate report is sent once predetermined thresholds are satisfied. This improved BLER reporting method eliminates BLER reporting by establishing thresholds of minimum number of received TBs. Reducing the frequency of BLER reporting is beneficial for conserving MAC resources used to produce and send the BLER report and RRC resources used to receive and process the BLER report.

Method 100 begins at step 101, where the count value i of received TBs is reset (i.e., i=0) and the count value S(i) of erroneously received TBs is reset (i.e., S(i)=0). At step 102, the TBs of UL channel data are received for a single TTI. Step 102 further includes obtaining the target BLER value, which preferably is determined by RRC of the RNC for each transport channel. Preferably, the BLER target value is based on a reference transport channel (RTrCH), representative for the transport channels on the CCTrCH. The BLER target value can change if the RTrCH is reselected during the initialization phase, but remains constant during the method 100 processing of a single TTI. Next at step 103, error checking of the received TBs is performed, preferably using CRC error codes. In step 104, TB count value i is incremented by the number of received TBs during the current TTI in step 102, and error count value S(i) is incremented by the number of erroneous TBs received during the current TTI. An estimate of the BLER is calculated in step 105, which is the ratio of the i and S(i) values of step 104:

$$BLER\_est = S(i)/i \qquad \text{Equation 1}$$

The remaining steps of method 100 determine whether thresholds are satisfied for triggering a BLER estimate report. The thresholds are selected to be significant enough to provide a meaningful estimate for the BLER. At step 106, TB count value i is examined against a first threshold T1_ithr for whether a minimum number of TBs were received in the current TTI. This first threshold T1_ithr is configurable, with a preferred default value of thirty (30). If TB count value i meets or exceeds threshold T1_ithr, then the threshold for trigger T1 is satisfied, trigger value T1 is sent to be included in the BLER report, and method 100 proceeds to step 108 for BLER estimate reporting. If TB count value i does not satisfy the trigger T1 threshold, step 107 for trigger value T2 commences, where it is determined whether TB count value i has reached a minimum threshold T2_ithr. The preferred default value for T2_ithr is twenty (20), and is also configurable. An additional threshold associated with trigger value T2 is examined in step 107 to determine whether the BLER estimate of step 105 is greater than a predetermined k factor multiple of the target BLER value (i.e., BLER_est≧k*BLER_target). The value k is derived that will indicate an estimate of BLER that is considered severe enough to produce an emergency BLER report. If either of these thresholds of step 107 is not satisfied, method 100 returns to step 102 for processing of the next set of TBs during the next TTI. If the threshold for step 107 is satisfied, then trigger value T2 is sent, and method 100 proceeds to step 108 for the BLER estimate reporting. Alternatively, the BLER estimate threshold comparison alone could be used to initiate trigger value T2 in method 100.

At step 108, a BLER estimate report is produced by MAC of the RNC and sent to the RRC of the RNC so that a new target SIR value may be determined accordingly. A summary of the parameters included in the BLER estimate report of initialization phase is presented in TABLE 1.

TABLE 1

| Parameter | Description |
| --- | --- |
| i | number of TBs observed |
| S(i) | number of observed TBs with errors |
| BLER_est | BLER estimate = S(i)/i |
| BLER_target | target BLER for the CCTrCH |
| Trigger value | T1 or T2 |
| CCTrCH | ID of the particular CCTrCH monitored (e.g., 0 to 255) |
| RTrCH | ID of the reference TrCH monitored |

The significance of which trigger value T1 or T2 is reported in the BLER estimate report is that the RRC will respond differently according to the particular trigger. The basis for the BLER estimate is significant for target SIR adjustment. Target SIR adjustments are made in predetermined ranges for step increments to maintain power adjustments that are as smooth as possible. In the initialization phase, it is preferable that SIR converges to the true target SIR as quickly as possible by an accurate and meaningful estimation of the BLER value. Triggers values T1 and T2 are predetermined at values that can best achieve this. Trigger value T1 signifies that the estimated BLER has lasted long enough to provide a statistically meaningful BLER estimation for the initialization phase while the BLER estimate is not severe enough to trigger an emergency report (i.e., as does trigger value T2). The predetermined value selected for T1_ithr is preferably chosen by fine tuning to the specific communication network environment. Trigger value T2, signifies that the estimated BLER is severe enough when compared to the target BLER such that a corrective action must be taken quickly to avoid troublesome interference and possibly a dropping of the call session. Hence, a factor k is chosen preferably with a default value k=5, whereby a BLER estimate equal to five times the target BLER value is considered severe. Of course a minimum sample size is required to ensure that the estimated BLER is statistically meaningful. The value 20 for T2_ithr is selected to ensure that the estimated BLER is statistically meaningful. Although a BLER report at step 108 according to the preceding threshold screening of method 100 results in more restrictively efficient BLER reporting, the RRC ultimately makes the final decision as to whether a target SIR adjustment signal is necessary, regardless of whether a BLER report is received.

With the UL BLER report having been sent in step 108, method 100 ends at step 109. The BLER report of method 100 initiates the BLER reporting process under steady state phase of power control, which will be further discussed in conjunction with FIG. 2. It should be noted that although method 100 has been described as having two trigger values, T1 and T2, additional triggers may be included for enhanced BLER reporting as needed.

Figure 2:
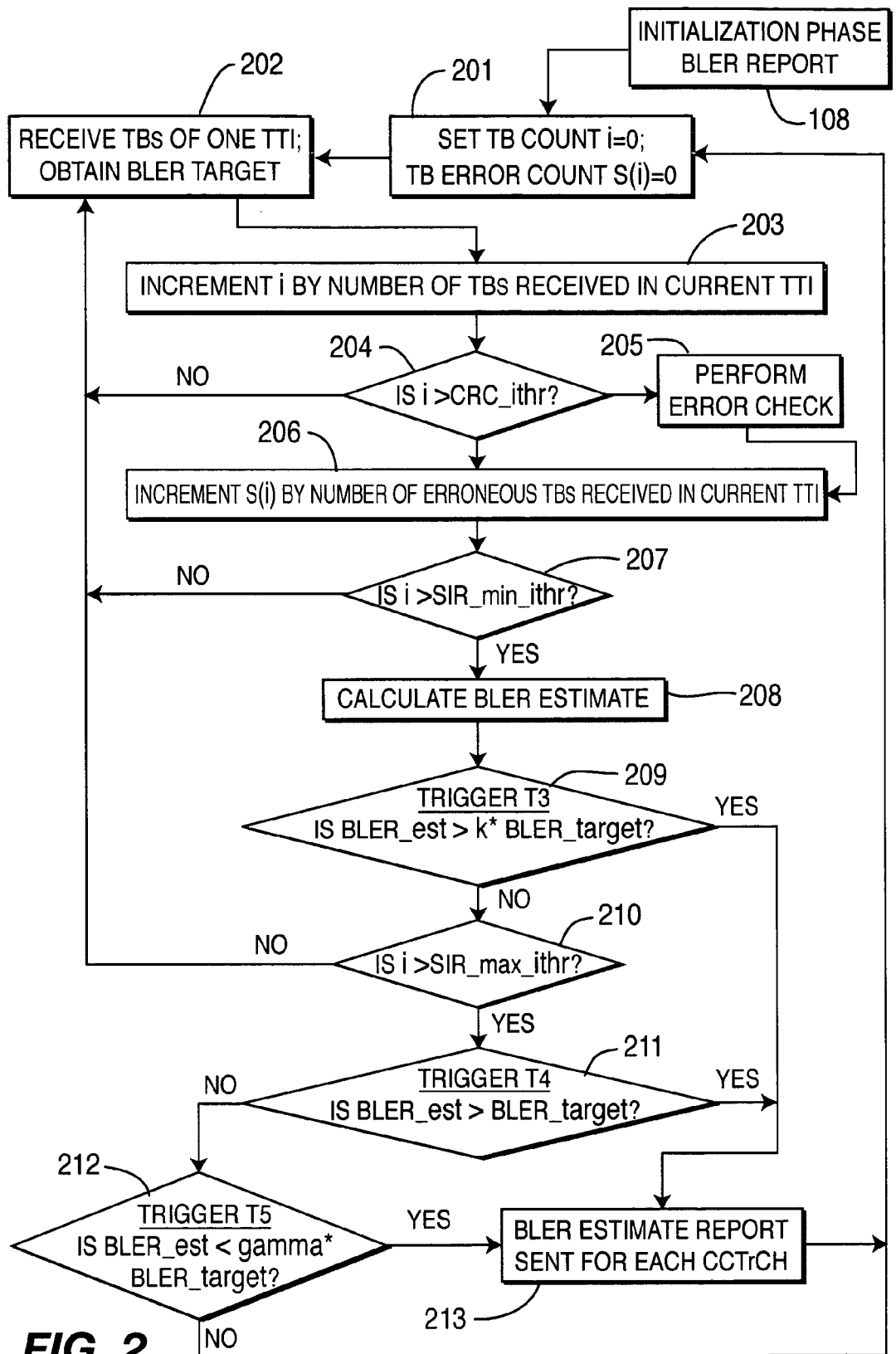
FIG. 2 shows a flow diagram for a method of BLER reporting during outer loop power control steady state phase.
Figure 3:
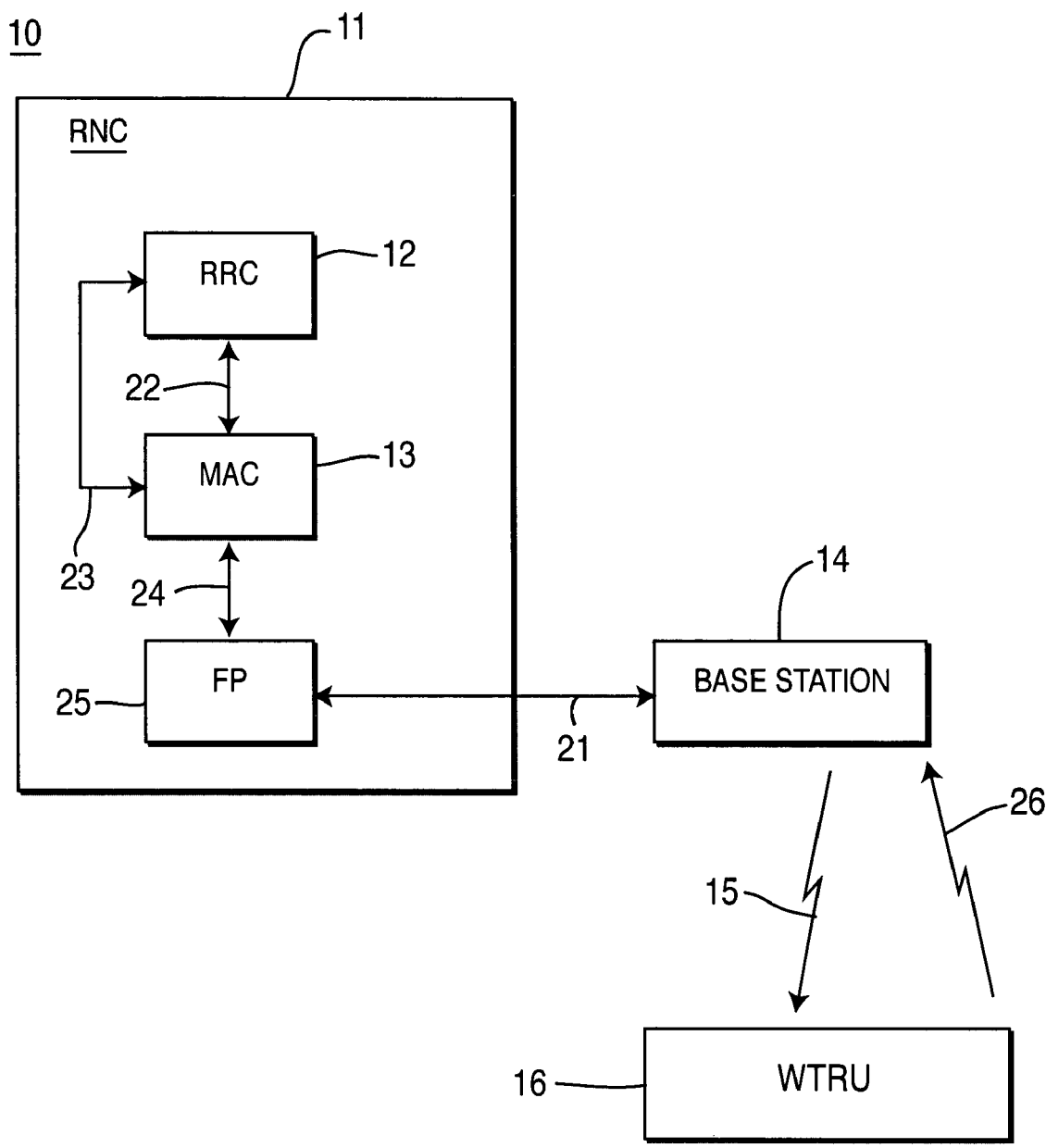
FIG. 3 shows a block diagram of a wireless communication system.

FIG. 2 shows a flow diagram of method 200, which performs BLER reporting during the steady state phase of the UL OLPC algorithm. Method 200 begins at step 201, responsive to BLER report during initialization phase (step 108). At step 201, count value i of received TBs and count value S(i) of erroneous TBs are initialized to zero (0). At step 202, TBs of one TTI associated with the monitored channel on the CCTrCH (preferably the RTrCH) are received from the base station. In the next step, step 203, count value i is incremented by the number of TBs received during the current TTI. Preferably, three separate count values are maintained: count value i, count value i_prev, and count value i_TTI_current, where value i represents the current count of received TBs, value i_prev represents the cumulative count of received TBs prior to the current TTI, and value i_TTI_current is the count of TBs received during the current TTI. During step 203, value i_prev is set to the value i, where value i equals the most recent cumulative count for TBs, prior to the current TTI. Next, count value i is incremented as follows:

$$i = i\_prev + i\_TTI\_current \quad \text{Equation 2}$$

Alternatively, a single count value i is maintained and incremented by the number of received TBs in the current TTI.

Method 200 next commences to examine several thresholds for BLER report triggers. At step 204, the first of these thresholds, CRC_ithr, is examined. Threshold CRC_ithr is used to provide a certain minimum latency between two consecutive SIR target adjustments. This minimum latency allows the impact of an SIR target adjustment signaled to WTRU to take place before another SIR target adjustment is sent. Threshold CRC_ithr is computed as follows:

$$CRC\_ithr = (RRC\_est\_delay * TB\_rate) / TTI\_L \quad \text{Equation 3}$$

where RRC_est_delay is the estimated signaling delay between RNC and WTRU, a configurable parameter with a default value of 400 ms. Value TB_rate represents the number of TBs received per TTI, and value TTI_L represents the length of TTI in milliseconds. For example, if estimated delay RRC_est_delay=400 ms, TB_rate=1, and TTI_L=20 ms, then CRC_ithr=20. It is to be noted that the number of TBs per TTI TB_rate for a given transport channel can vary depending on the selected transport format. In that case, the minimum TB_rate value is selected for computation of threshold CRC_ithr according to Equation 3. Threshold CRC_ithr is configurable with a preferred default value equal to 20.

Returning to FIG. 2, if TB count value i is greater than threshold CRC_ithr at step 204, then method 200 proceeds to step 205 where error checking is performed, preferably with CRC error codes. If the step 204 threshold is not satisfied, then method 200 returns to step 202 for processing the next set of received TBs for the duration of the next TTI.

At step 206, count value S(i), which represents the number of erroneous TBs, is incremented using the following relationship:

$$S(i) = S(i\_prev) + \sum_{j=i\_prev+1}^{i} C(j) \quad \text{Equation 4}$$

where j represents the sequence of TBs for i≧CRC_ithr. Error bit C(j) is either zero (0) or one (1). If block j has CRC error, then error bit C(j)=1. If block j has no CRC error or j<CRC_ithr, then error bit C(j)=0.

Next, decision step 207 checks whether the value i of received TBs is greater than predetermined threshold value SIR_min_ithr. Preferably, SIR_min_ithr is computed as follows:

$$SIR\_min\_ithr = CRC\_ithr + (0.2/BLER\_target) \quad \text{Equation 5}$$

The coefficient 0.2 is predetermined and to ensure some level of minimum spacing in time between consecutive SIR target updates. For example, continuing with the example of CRC_ithr=20, if the BLER_target is $10^{-2}$, which is typical for voice service, then the SIR_min_ithr will be:

$$SIR\_min\_ithr = 20 + (0.2/0.01) = 40.$$

Considering a TTI_L of 20 ms where TB_rate=1 TB/TTI, and the threshold for TBs is SIR_min_ithr=40, then an estimated delay RRC_est_delay of 800 ms is ensured between SIR target updates. Substituting a value of $10^{-3}$ for BLER_target in Equation 3, this minimum TB threshold value becomes much greater (i.e., SIR_min_ithr=220), which provides a much longer minimum delay between SIR target updates (i.e., RRC_est_delay=4400 ms). To rationalize this relatively long delay, it should be noted that the values chosen to calculate RRC_est_delay in this example are for demonstrative purpose, and that other values representative of the system parameters may occur. However, this example does demonstrate that stricter BLER requirements (i.e., smaller BLER requirement values) require longer processing. It should be noted that different types of transmissions will have different BLER requirements. For instance, when comparing voice and data types of transmissions, voice transmission are more likely have a BLER requirement of $10^{-2}$ and data transmission would likely have a BLER requirement closer to $10^{-3}$. Accordingly, the expected delays to ensure QoS are longer for a data download than for a voice transmission, such as the 800 ms delay (at BLER_target=$10^{-2}$) compared to the 4400 ms delay (at BLER_target=$10^{-3}$) calculated above. Further, the rate of transmission varies depending on the information type sent within the transport blocks. For instance, the rate for voice may be TB_rate=1, while data TBs may be transmitted at a higher rate (TB_rate>1). Substituting such a system parameter TB_rate for the above example where BLER_target=$10^{-3}$, would also substantially reduce the 4400 ms estimated delay value RRC_est_delay of the above example.

If at step 207, TB count value i<SIR_min_ithr, then the threshold is not satisfied, and method 200 returns to step 202 to receive the next TTI set of TBs. If step 207 threshold comparison is satisfied, the BLER estimate BLER_est is then calculated using the following ratio at step 208:

$$BLER\_est = S(i)/(i\_prime) \quad \text{Equation 6}$$

where $$i\_prime = (i\text{-CRC\_ithr}). \quad \text{Equation 7}$$

Process 200 next enters a sequence of decision criteria for trigger values T3, T4 and T5, whereby BLER estimate value BLER_est is compared to target BLER values for possible acceptance and reporting. At step 209, BLER estimate BLER_est is compared against the product of target BLER_target and the configurable k factor. As aforementioned, the preferable default k factor value is k=5. If BLER_est satisfies the threshold of step 209, trigger value T3 is sent for BLER estimate reporting. Trigger value T3 indicates that an emergency BLER report is being sent as the BLER estimate significantly exceeds the BLER target. Table 2 summarizes the parameters that preferably are sent in the BLER estimate report for steady state phase.

TABLE 2

| Parameter | Description |
| --- | --- |
| i_prime | number of TBs observed minus CRC_ithr value |
| S(i) | number of observed TBs with errors |
| BLER_est | BLER estimate = S(i)/i_prime |
| BLER_target | target BLER for the CCTrCH |
| Trigger value | T3, T4 or T5 |
| CCTrCH | ID of the particular CCTrCH monitored (e.g., 0 to 255) |
| RTrCH | ID of the reference TrCH monitored |

If at step 209 the threshold for trigger value T3 is not satisfied, method 200 proceeds to step 210, where TB count value i is compared to threshold value SIR_max_ithr. The threshold comparison is satisfied if value i is greater than threshold SIR_max_ithr. The value SIR_max_ithr is the maximum duration the steady state phase of the OLPC algorithm can run for as long as there is no need for an emergency BLER report. Threshold value SIR_max_ithr is calculated as follows:

$$SIR\_max\_ithr = CRC\_ithr + (1.8/BLER\_target) \quad \text{Equation 8}$$

For example, if the BLER target value BLER_target=$10^{-2}$, then threshold value SIR_max_ithr=200 TBs, which is gives a difference of 160 TBs reception between SIR_max_ithr and SIR_min_ithr. Further, if TTI_L=20 ms, and TB_rate=1 TB/TTI, then there will be a difference of 3200 ms between SIR_min_ithr and SIR_max_ithr. Thus, at any time during this 3200 ms duration between these thresholds, an emergency BLER report with respect to trigger value T3 can occur if the estimated BLER value BLER_est satisfies the threshold at step 209.

If the comparison of step 210 is not satisfied, then process 200 returns to step 202 for receiving the next set of TBs. If TB count i satisfies the threshold SIR_max_ithr, then analysis associated with trigger value T4 commences in step 211.

Trigger value T4 is sent if BLER estimate value BLER_est is greater than an alpha factor multiple of value BLER_target, wherein the preferred value for factor alpha is alpha=1. If the step 211 comparison is satisfied, a BLER estimate report is prepared and sent (step 213) according to trigger value T4. If the threshold for trigger value T4 is not satisfied, then the test for trigger value T5 commences at step 212. The trigger T5 test is whether the estimated BLER is below the target BLER by a gamma factor (i.e., BLER_est<gamma*BLER_target), where gamma<1. Preferably, the configurable default value for gamma is gamma=0.85. If trigger T5 criteria is satisfied, then a BLER estimate report is sent with trigger value T5 (step 213). The BLER report according to trigger value T5 indicates that the BLER estimate is so low as to justify an adjustment to reduce the SIR target value, which lowers the transmit signal power and system resources. If BLER_est≧(0.85) BLER_target, then a BLER report is not triggered, and method 200 is repeated beginning with step 201, since none of the trigger tests (i.e., tests related to trigger values T3-T5) were satisfied.

As described, the BLER estimate report is preferably triggered by trigger values T5 or T4 only if BLER_est<(0.85) BLER_target, or BLER_est>BLER_target, respectively. These trigger values T4 and T5 are set by thresholds related to BLER_target such that a BLER report will initiate a SIR target adjustment upward to maintain signal quality to the user (i.e., when BLER_est>BLER_target), and a reduction of the SIR target when the BLER estimate is low enough to warrant savings in system resources. As such, trigger values T4 and T5 provide the necessary balancing between impact to the user and system resources. Although trigger values T4 and T5 are described as related to BLER_target factors of alpha=1 and gamma=0.85, respectively, other values for factors alpha and gamma may be used to achieve the desired balancing results within the scope of the present invention. For example, certain tolerances or margins may be incorporated into factor values alpha and gamma.

Overall, method 200 reduces the BLER estimate reporting due to the thresholds that must be satisfied prior to sending the BLER report, such as step 207, which ensures that a minimum number of TBs has been received. Also, a BLER report is not sent if the BLER estimate is within the range between satisfying trigger values T4 and T5: (gamma) BLER_target≦BLER_est≦(alpha)BLER_target. This is the range considered to include BLER estimates that would not likely initiate an SIR target adjustment, and therefore method 200 eliminates needless BLER reporting of such BLER estimates.

Table 3 summarizes the preferred default values for the threshold comparisons of the steady state BLER estimate report method 200:

TABLE 3

| Parameter | Default value |
| --- | --- |
| CRC_ithr | 20 |
| SIR_min_ithr | 40 |
| SIR_max_ithr | 200 |
| k | 5 |
| alpha | 1 |
| gamma | 0.85 |

Figure 4A:
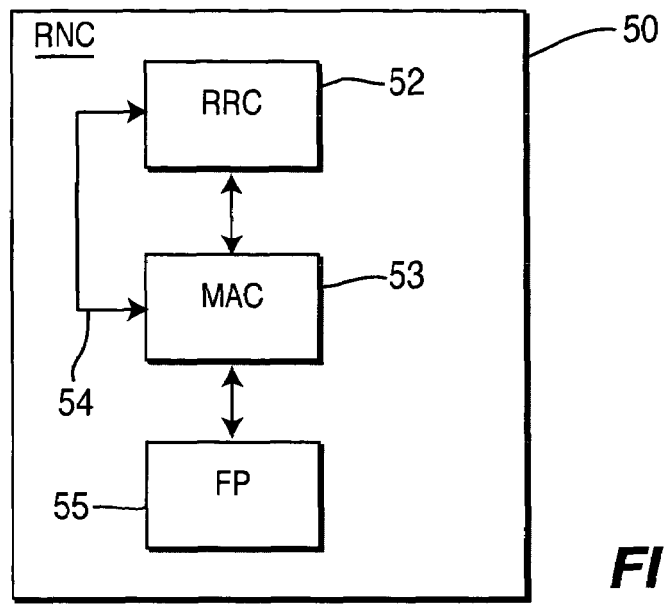
FIGS. 4A-4B show block diagrams of an RNC related to the present invention.
Figure 4B:
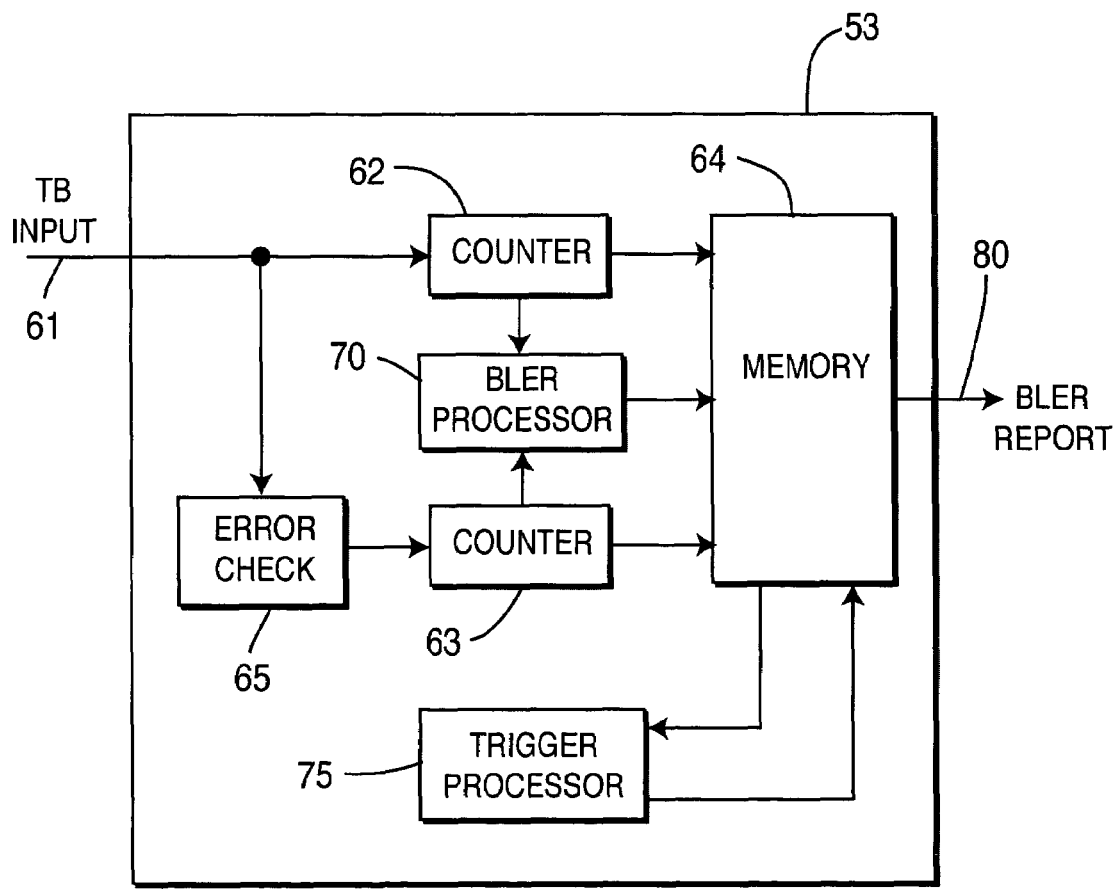

Implementation of the preferred methods will now follow in reference to FIGS. 4A-4B. FIG. 4A shows a block diagram for an RNC 50. Since the general functionality of an RNC is known by those skilled in the art, the related components will only be described hereinafter to the extent that such functionality is relevant to the present invention. RNC 50 comprises many components that interact on several communication layers, but those of interest for the purpose of the present invention are shown in FIG. 4A. RRC layer 52 is linked to MAC layer 53 and FP entity 55. MAC layer 53 may comprises several entities, each of which communicates particular communication channels. The BLER estimation and BLER estimate report according to the present invention is generated by a MAC 53 entity, or alternatively, by FP entity 55. The BLER report is preferably communicated to RRC 52 across MAC control line 54.

FIG. 4B shows a block diagram of related components for performing the BLER reporting according to the present invention. Counter 62 performs the counting of received TBs and maintains count values i, i_prev and i_TTIcurrent and may use memory 64 as necessary. Error check unit 65 performs CRC error checking on the received TBs and counter 63 tracks the number S(i) of received TBs having errors. BLER estimate processor 70 receives values i and S(i) and performs the BLER estimation according to Equation 1. Memory unit 64 stores the TB count value i, TB error count S(i), and the BLER estimate value from BLER processor 70 to be sent in the BLER report 80. Memory 64 also stores the trigger thresholds used during initialization phase method 100 (i.e., BLER_target, factor k, T1_ithr, and T2_ithr) and those used during steady state phase method 200 (i.e., factor k, CRC_ithr, SIR_min_ithr, SIR_max_ithr, gamma).

Trigger processor 75 performs the threshold comparisons for triggers T1-T5. Trigger processor receives input from TB counter 62, BLER estimate processor 70, and memory unit 64. During the initialization phase related to method 100, trigger processor 75 performs the threshold comparison for trigger value T1 based on TB count value i from counter 62 and threshold values T1_ithr stored in memory unit 64. The first threshold comparison for trigger value T2 is based on TB count value i from counter 62 against threshold value T2_ithr stored in memory unit 64. The second threshold comparison for trigger value T2 is based on factor k and target BLER values stored in memory unit 64 and input BLER_est from BLER estimate processor 70.

During steady state phase, trigger processor 75 processes TB count i from counter 62 for comparison to threshold values CRC_ithr, SIR_min_ithr and SIR_max_ithr from memory unit 64, related to steps 204, 206, and 208 of method 200, respectively. Trigger values T3-T5 are initiated by trigger processor 75 based on comparison of BLER estimate value BLER_est from BLER estimate processor 70 to the product of factor k and target BLER value BLER_target, both taken from memory unit 64. Trigger value T4 is produced by trigger processor 75 when value BLER_est is greater than target BLER value BLER_target.

Although the BLER reporting implementation related to FIG. 4B has been described with two separate processors, BLER estimate processor 70 and trigger processor 75, the BLER reporting according to the present invention could alternatively be performed by a single processor, or more than two processors, to achieve the same results. Further, memory unit 64 may alternatively comprise a plurality of memory units, buffers, or registers.

What is claimed is:

1. A method for block error rate (BLER) estimate reporting in a wireless transmit receive unit (WTRU), the method comprising:
receiving a communication channel and for each of a series of successive time intervals:

counting a number of data blocks received over the time interval;

storing a value i representative of the number of data blocks received;

performing error checking on the data blocks received;

storing a value S(i) representative of the number of data blocks having errors;

comparing value i to a first predetermined threshold to produce a first BLER estimate report trigger when i exceeds the threshold;

calculating a BLER estimate based on the values i and S(i);

comparing value i to a second predetermined threshold to produce a second BLER estimate report trigger when the BLER estimate exceeds the a predetermined multiple of the target BLER value; and sending a BLER estimate report in response to the production of the first or second report triggers; whereby no report is sent when the first or second triggers are not produced.

2. The method of claim 1 wherein said BLER estimate report is reflective of data block reception over a time interval that includes the i number of observed data blocks over the time interval; the S(i) number of erroneous data blocks over the time interval; the BLER estimate for the time interval; and an identification of the report trigger.

3. The method of claim 2 wherein the data blocks are transport blocks (TBs) associated with a plurality of transport channels (TrCHs) multiplexed on a coded composite transport channel (CCTrCH), each transport channel having a target BLER based on quality of service requirement and the method is performed with respect to a selected channel identified as a reference transport channel (RTrCH).

4. The method of claim 3 wherein said BLER estimate is representative of the CCTrCH, said report further comprising:
a target BLER for the CCTrCH;
an identification code for the CCTrCH.

5. The method of claim 4 wherein said report further comprises:
an identification code for the reference transport channel.

6. A method for block error rate (BLER) estimate reporting in a wireless transmit receive unit (WTRU), the method comprising:
a) receiving the communication channel and for each of a series of successive time intervals:

b) storing a value i representative of the number of received data blocks and a value i_prime representative of value i minus a predetermined minimum number of data blocks related to performing error checking with a predetermined minimum acceptable accuracy;

c) performing error checking on the received data blocks;

d) storing a value S(i) representative of the number of data blocks having errors;

e) calculating a BLER estimate based on the i_prime and S(i) values;

f) comparing value i to a first predetermined threshold based on a minimum number of data blocks to calculate cyclic redundancy error check on the data blocks, a second predetermined threshold for a minimum number of data blocks, and a third predetermined threshold for a maximum number of data blocks;

g) comparing the BLER estimate to at least one predetermined threshold equal to a multiple of the target BLER value to produce at least one BLER estimate report trigger; and h) sending a BLER estimate report upon the production of the report trigger, wherein the BLER reporting occurs during a steady state phase of a call session between two entities of the communication system, wherein said steps are repeated to the extent possible, during the call session in entirety.

7. The method of claim 6 wherein step (g) further comprises a first predetermined threshold of a k multiple of the target BLER, wherein k>1.

8. The method of claim 7 wherein step (g) further comprises a second predetermined threshold of an alpha multiple of the target BLER, wherein alpha=1.

9. The method of claim 8 wherein step (g) further comprises a third predetermined threshold of a gamma multiple of the target BLER, wherein gamma<1.

10. The method of claim 6 wherein said BLER estimate report is reflective of data block reception over a time interval that includes the i_prime number of data blocks; the S(i) number of erroneous data blocks; the BLER estimate; and an identification of the report trigger.

11. The method of claim 10 wherein the data blocks are transport blocks (TBs) associated with a plurality of transport channels (TrCHs) multiplexed on a coded composite transport channel (CCTrCH), each transport channel having a target BLER based on quality of service requirement and the method is performed with respect to a selected channel identified as a reference transport channel (RTrCH), and wherein the transport blocks are associated with a plurality of transport channels multiplexed on a coded composite transport channel (CCTrCH), each transport channel having a target BLER based on quality of service requirement.

12. The method of claim 11 wherein said BLER estimate is representative of the CCTrCH, said report further comprising:

a target BLER for the CCTrCH;
an identification code for the CCTrCH.

13. The method of claim 12 wherein BLER measurement is performed a reference transport channel and BLER estimate report further comprises:

an identification code for the reference transport channel.

14. A wireless transmit receive unit (WTRU) comprising a receiver the receiver comprising:

an error check unit configured to perform error checking on the data blocks received;
at least one counter configured to count i number of data blocks received over the time interval and S(i) number of data blocks having errors;
a processor configured to compare value i to at least one predetermined threshold; configured to calculate a BLER estimate based on the values i and S(i); configured to compare the BLER estimate to at least one predetermined multiple of a target BLER value for the channel to produce at least one BLER estimate report trigger when the BLER estimate exceeds the predetermined multiple of the target BLER value; and configured to create a BLER estimate report in response to the production of at least one report trigger, wherein said BLER estimate report is reflective of data block reception over a time interval that includes the i number of observed data blocks over the time interval; the S(i) number of erroneous data blocks over the time interval; the BLER estimate for the time interval; and an identification of the report trigger; and a memory unit for storing the count values i and S(i), the BLER estimate, and the trigger threshold values.

15. The invention of claim 14 wherein the data blocks are transport blocks (TBs) associated with a plurality of transport channels (TrCHs) multiplexed on a coded composite transport channel (CCTrCH), each transport channel having a target BLER based on quality of service requirement and the BLER estimate is associated with a selected channel identified as a reference transport channel (RTrCH).

16. The invention of claim 15 wherein said BLER estimate is representative of the CCTrCH, said report further comprising:

a target BLER for the CCTrCH;
an identification code for the CCTrCH.

17. The invention of claim 16 wherein said report further comprises:

an identification code for the reference transport channel.

18. The invention of claim 14 wherein the processor is further configured to compare value i to a first predetermined threshold based on a minimum number of data blocks to calculate cyclic redundancy error check on the data blocks.

19. The invention of claim 18 wherein the processor is further configured to compare value i to a second predetermined threshold for a minimum number of data blocks, and a third predetermined threshold for a maximum number of data blocks.

20. The invention of claim 14 wherein the processor is further configured to compare the BLER estimate to a first predetermined threshold of a k multiple of the target BLER to produce at least one report trigger, wherein k>1.

21. The invention of claim 14 wherein the processor is further configured to compare the BLER estimate to a second predetermined threshold of an alpha multiple of the target BLER to produce at least one report trigger, wherein alpha=1.

22. The invention of claim 14 wherein the processor is further configured to compare the BLER estimate to a third predetermined threshold of a gamma multiple of the target BLER to produce at least one report trigger, wherein gamma<1.

* * * * *

UNITED STATES PATENT AND TRADEMARK OFFICE
CERTIFICATE OF CORRECTION

PATENT NO. : 7,423,976 B2
APPLICATION NO. : 10/667753
DATED : September 9, 2008
INVENTOR(S) : Wang et al.

It is certified that error appears in the above-identified patent and that said Letters Patent is hereby corrected as shown below:

IN THE SPECIFICATION

At column 2, line 3, after the word "communication", delete "system" and insert therefor --systems--.

At column 3, replace lines 15 - 34, with the following:
--3G   Third Generation
 BLER   block error rate
 CCTrCH   coded composite transport channel
 CRC   cyclic redundancy check
 DL   downlink
 FP   frame protocol
 MAC   medium access control
 OLPC   outer loop power control
 QoS   quality of service
 RNC   radio network controller
 RRC   radio resource control
 RTrCH   reference transport channel
 SIR   signal to interference ratio
 TB   transport block
 TrCH   transport channel
 TTI   transmission time interval
 UL   uplink
 UMTS   universal mobile telecommunications system
 UTRAN   UMTS terrestrial radio access network
 WTRU   wireless transmit/receive unit--.

At column 5, line 15, before the word "chosen", delete "kis" and insert therefor --k is--.

At column 7, line 57, before the word "gives", delete "is".

At column 8, line 27, before "SIR", delete "a" and insert therefor --an--.

At column 9, line 7, after the word "may", delete "comprises" and insert therefor --comprise--.

UNITED STATES PATENT AND TRADEMARK OFFICE
CERTIFICATE OF CORRECTION

PATENT NO. : 7,423,976 B2
APPLICATION NO. : 10/667753
DATED : September 9, 2008
INVENTOR(S) : Wang et al.

It is certified that error appears in the above-identified patent and that said Letters Patent is hereby corrected as shown below:

IN THE CLAIMS

At claim 13, column 11, line 43, after the word "performed", insert --on--.

Signed and Sealed this

Second Day of December, 2008

JON W. DUDAS
*Director of the United States Patent and Trademark Office*